United States Patent
Xing et al.

(10) Patent No.: US 9,607,982 B1
(45) Date of Patent: Mar. 28, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Su Xing, Singapore (SG); Hsueh-Wen Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/209,771

(22) Filed: Jul. 14, 2016

(30) Foreign Application Priority Data

Jun. 14, 2016 (TW) .............................. 105118570 A

(51) Int. Cl.
| | |
|---|---|
| *H01L 27/06* | (2006.01) |
| *H01L 29/66* | (2006.01) |
| *H01L 29/06* | (2006.01) |
| *H01L 21/8249* | (2006.01) |
| *H01L 27/02* | (2006.01) |
| *H01L 29/49* | (2006.01) |
| *H01L 29/26* | (2006.01) |

(52) U.S. Cl.
CPC ...... *H01L 27/0635* (2013.01); *H01L 21/8249* (2013.01); *H01L 27/0207* (2013.01); *H01L 27/0617* (2013.01); *H01L 29/0649* (2013.01); *H01L 29/26* (2013.01); *H01L 29/4966* (2013.01); *H01L 29/66234* (2013.01); *H01L 27/06* (2013.01)

(58) Field of Classification Search
CPC ............. H01L 27/0635; H01L 27/0207; H01L 29/0649; H01L 29/26; H01L 29/4966; H01L 29/66234; H01L 21/8249; H01L 27/06; H01L 27/0617
See application file for complete search history.

(56) References Cited

U.S. PATENT DOCUMENTS

| | | | | |
|---|---|---|---|---|
| 5,108,945 | A | * 4/1992 | Matthews | ......... H01L 21/28211 148/DIG. 136 |
| 9,170,591 | B2 | 10/2015 | Pons | |
| 2010/0001369 | A1* | 1/2010 | Chuang | ............... H01L 21/8249 257/526 |

(Continued)

OTHER PUBLICATIONS

Shao Hui Wu et al., Extremely Low Power C-Axis Aligned Crystalline In—Ga—Zn—O 60 nm Transistor Integrated with Industry 65 nm Si MOSFET for IoT Normally-Off CPU Application, VLSI 2016 Technology Paper UMC, Jan. 25, 2016.

(Continued)

*Primary Examiner* — Nathan W Ha
(74) *Attorney, Agent, or Firm* — Winston Hsu; Scott Margo

(57) ABSTRACT

A method for fabricating semiconductor device is disclosed. First, a substrate is provided, a bipolar junction transistor (BJT) is formed on the substrate, a metal-oxide semiconductor (MOS) transistor is formed on the substrate and electrically connected to the BJT, a resistor is formed on the substrate and electrically connected to the MOS transistor, a dielectric layer is formed on the substrate to cover the BJT, the MOS transistor, and the resistor, and an oxide-semiconductor field-effect transistor (OS-FET) is formed on the dielectric layer and electrically connected to the MOS transistor and the resistor.

20 Claims, 6 Drawing Sheets

(56) References Cited

U.S. PATENT DOCUMENTS

| | | | |
|---|---|---|---|
| 2013/0095580 A1* | 4/2013 | Or-Bach | H01L 23/481 438/17 |
| 2014/0002187 A1* | 1/2014 | McPartlin | H01L 29/7378 330/250 |
| 2014/0035158 A1* | 2/2014 | Chang | H01L 23/481 257/774 |
| 2015/0014813 A1 | 1/2015 | Mueller | |
| 2015/0067429 A1* | 3/2015 | Edwards | G01R 31/2818 714/734 |
| 2015/0091537 A1* | 4/2015 | Caffee | G05F 1/575 323/265 |
| 2015/0102384 A1* | 4/2015 | Zhan | H01L 27/0262 257/173 |
| 2015/0175406 A1* | 6/2015 | Lin | B81B 7/007 257/415 |
| 2015/0311251 A1* | 10/2015 | Yi | H01L 27/222 257/421 |
| 2015/0326217 A1* | 11/2015 | Barrenscheen | H01L 27/0266 327/543 |

OTHER PUBLICATIONS

Shih-Cheng Chen et al., Title: Semiconductor Device, pending U.S. Appl. No. 15/206,319, filed Jul. 11, 2016.

Zhibiao Zhou et al., Title: Semiconductor Memory Device and Semiconductor Memory Array Comprising the Same, pending U.S. Appl. No. 15/180,095, filed Jun. 13, 2016.

Su Xing et al., Title: Oxide Semiconductor Transistor and Manufacturing Method Thereof, pending U.S. Appl. No. 15/253,896, filed Sep. 1, 2016.

* cited by examiner

SEMICONDUCTOR DEVICE AND METHOD FOR FABRICATING THE SAME

BACKGROUND OF THE INVENTION

1. Field of the Invention

The invention relates to a semiconductor device and fabrication method thereof, and more particularly to a low dropout (LDO) regulator and fabrication method thereof.

2. Description of the Prior Art

As the demand for electronic product increased day by day, the complexity of the functions for electronic products also increased significantly. Depending on the functions required, different voltage conversion circuits such as switching regulators and linear regulators are often included in today's electronic devices. Among which, a linear regular commonly used today is known as the low dropout regulator. Since low dropout regulators have advantages of low cost, simple circuit, low noise, and being able to provide stable voltage output, they have been widely used in a numerous portable electronic devices.

SUMMARY OF THE INVENTION

According to a preferred embodiment of the present invention, a method for fabricating semiconductor device is disclosed. First, a substrate is provided, a bipolar junction transistor (BJT) is formed on the substrate, a metal-oxide semiconductor (MOS) transistor is formed on the substrate and electrically connected to the BJT, a resistor is formed on the substrate and electrically connected to the MOS transistor, a dielectric layer is formed on the substrate to cover the BJT, the MOS transistor, and the resistor, and an oxide-semiconductor field-effect transistor (OS-FET) is formed on the dielectric layer and electrically connected to the MOS transistor and the resistor.

According to another aspect of the present invention, a semiconductor device is disclosed. The semiconductor device includes: a substrate; a bipolar junction transistor (BJT) on the substrate; a metal-oxide semiconductor (MOS) transistor on the substrate and electrically connected to the BJT; a resistor on the substrate and electrically connected to the MOS transistor; a dielectric layer on the substrate to cover the BJT, the MOS transistor, and the resistor; and an oxide-semiconductor field-effect transistor (OS-FET) on the dielectric layer and electrically connected to the MOS transistor and the resistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
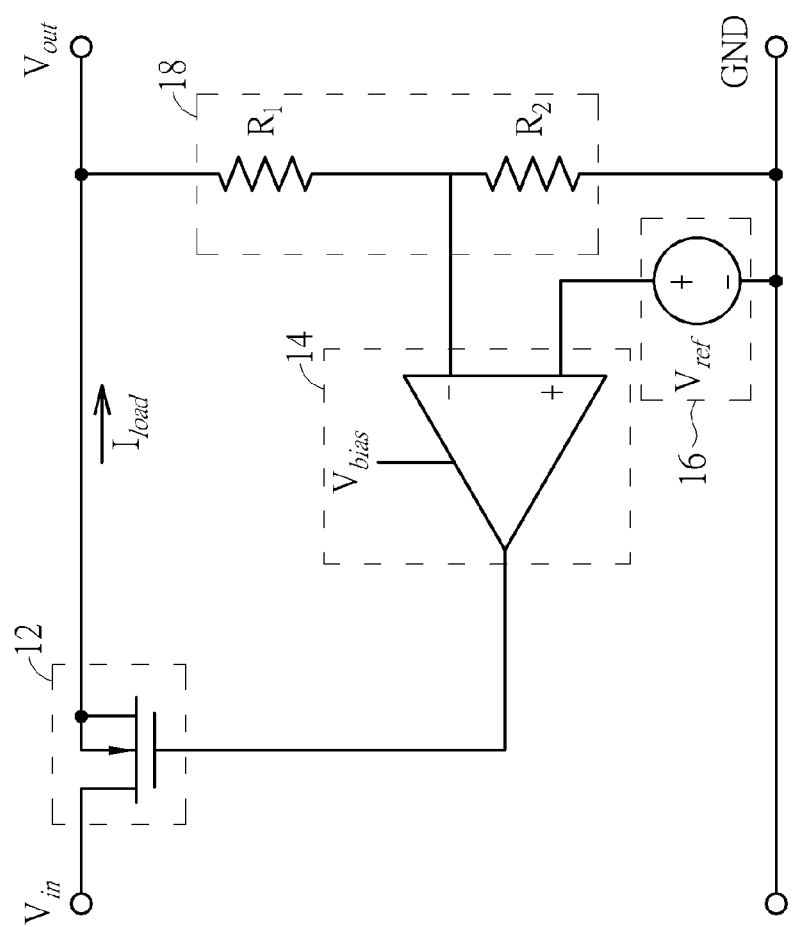
FIG. 1 illustrates a schematic view of a low dropout regulator according to a preferred embodiment of the present invention.

Referring to FIG. 1, FIG. 1 illustrates a schematic view of a low dropout regulator according to a preferred embodiment of the present invention. As shown in FIG. 1, the low dropout regulator preferably includes a pass transistor 12, an error amplifier 14, a bandgap reference 16, and a feedback circuit 18.

The low dropout regulator operates by stabilizing the output voltage (Vout) when the input voltage (Vin) or output current (Iout) fluctuates. In operation, the output voltage is sampled through a resistive divider connected to an inverting input of the error amplifier 14 while the non-inverting input of the error amplifier 14 is connected to a reference voltage (Vref). The reference voltage is preferably generated by the bandgap reference 16 within the integrated circuit and the error amplifier 14 always tries to maintain a balance between two ends of the circuit. By doing so, a stabilized output voltage is guaranteed.

In most applications, the low dropout regulator functions to isolate sensitive loadings from power source carrying noises. Different from switching regulators, low dropout regulator typically adjusts or maintains output voltage at pass transistor 12 so that the pass transistor 12 often functions as a voltage controlling power source during normal operation. The pass transistor 12 is driven by the compensated signals from the error amplifier 14, the error amplifier 14 could detect output voltage and compare the output voltage with reference voltage, and all of these functional blocks affect the performance of the low dropout regulator substantially.

Figure 2:
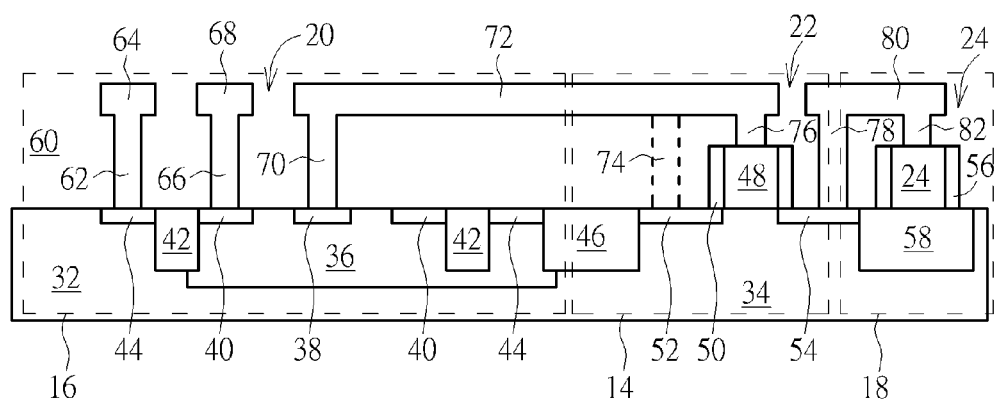
FIG. 2 illustrates a method for fabricating a low dropout regulator according to a preferred embodiment of the present invention.
Figure 3:
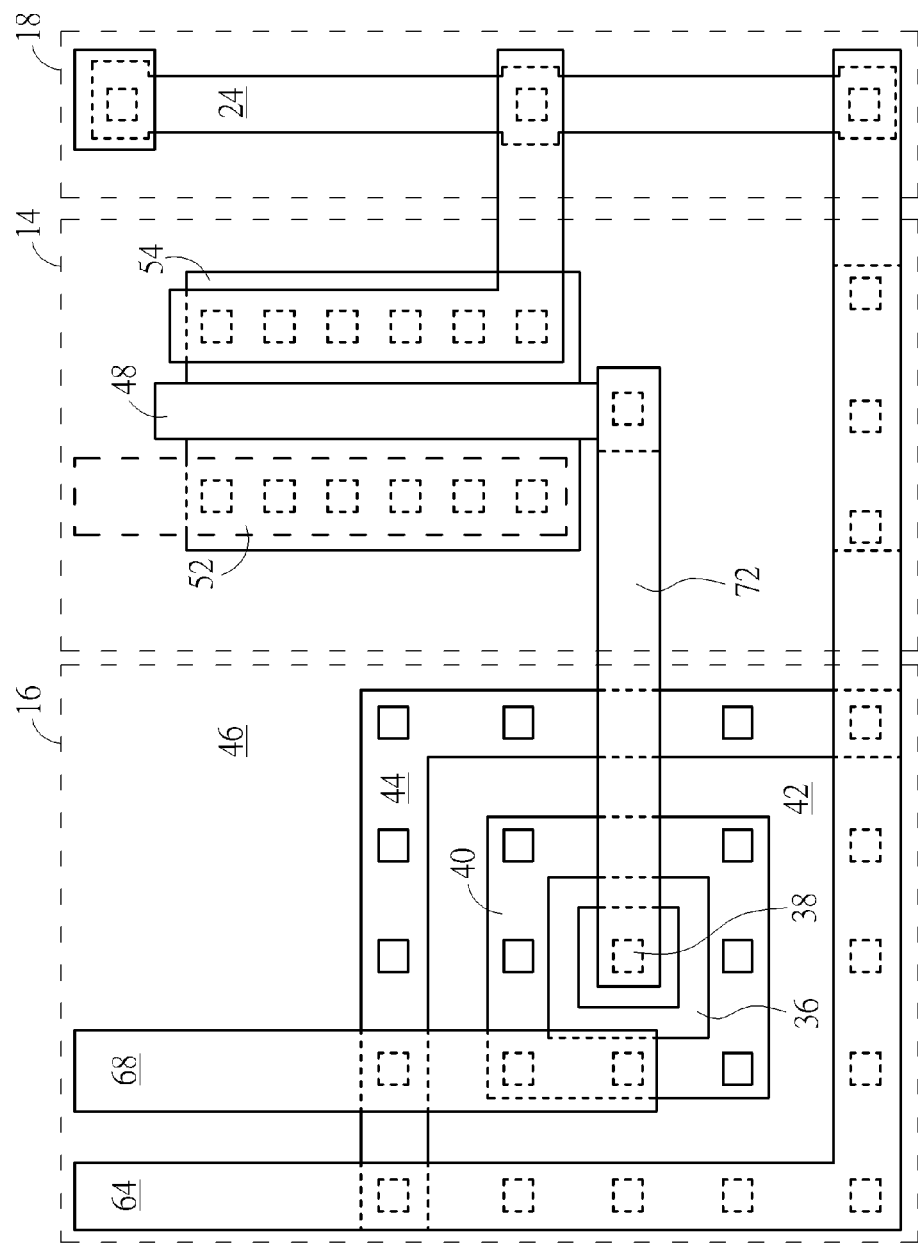
FIG. 3 illustrates a top view of the layout of the bandgap reference, error amplifier, and feedback circuit shown in FIG. 2.

Referring to FIGS. 2-3, FIG. 2 illustrates a method for fabricating a low dropout regulator according to a preferred embodiment of the present invention, and FIG. 3 illustrates a top view of the layout of the bandgap reference 16, error amplifier 14, and feedback circuit 18 shown in FIG. 2. First, as shown in the architecture in FIG. 2, the bandgap reference 16 is represented by a bipolar junction transistor (BJT) 20, the error amplifier 14 is represented by a metal-oxide semiconductor (MOS) transistor 22, and the feedback circuit 18 is represented by a resistor 24.

As shown in FIGS. 2-3, a substrate 32 is first provided, a p-well 34 is formed in the substrate 32, and a BJT 26 20, a MOS transistor 22, and a resistor 24 are formed on the substrate 32, in which the MOS transistor 22 is disposed between the BJT 20 and resistor 24 and electrically connected to the BJT 20 and resistor 24 at the same time.

In this embodiment, the BJT 20 includes a n-well 36 disposed in the substrate 32, a p-type doped region 38 disposed in the n-well 36, a n-type doped region 40 surrounding the p-type doped region 38, a shallow trench isolation (STI) 42 surrounding the n-well 36 and n-type doped region 40, a p-type doped region 44 surrounding the STI 42, and another STI 46 surrounding the p-type doped region 44.

The MOS transistor 22 includes a gate structure 48 on the substrate 32, a spacer 50 adjacent to the sidewalls of the gate structure 48, a n-type doped region 52 in the substrate 32 adjacent to one side of the gate structure 48 and another n-type doped region 45 in the substrate 32 adjacent to another side of the gate structure 48. The two n-type doped regions 52, 54 preferably constitute the source/drain region of the MOS transistor 22. In this embodiment, the spacer 50 could be selected from the group consisting of silicon oxide, silicon nitride, silicon oxynitride (SiON), and silicon carbon nitride (SiCN), and the gate structure 48 could be a polysilicon gate or a metal gate depending on the demand of the process.

If the gate structure were to be a metal gate, the metal gate could further include a high-k dielectric layer, a work function metal layer, and a low resistance metal layer. The high-k dielectric layer is preferably selected from dielectric materials having dielectric constant (k value) larger than 4. For instance, the high-k dielectric layer may be selected from hafnium oxide ($HfO_2$), hafnium silicon oxide (HfSiO$_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The work function metal layer is formed for tuning the work function of the later formed metal gates to be appropriate in an NMOS or a PMOS. For an NMOS transistor, the work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer and the low resistance metal layer, in which the material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof.

The feedback circuit 18 preferably includes a resistor 24, a spacer 56 on the sidewalls of the resistor 24, and a STI 58 in the substrate 32 directly under the resistor 24. The resistor 24 is preferably made of polysilicon, but not limited thereto.

Next, a dielectric layer 60, such as an interlayer dielectric (ILD) layer is formed to cover the BJT 20, the MOS transistor 22, and the resistor 24, and a plurality of contact plugs composed of trench conductor and via conductor are formed to electrically connect to the BJT 20, MOS transistor 22, and resistor 24. Specifically, via conductor 62 and trench conductor 64 are disposed on the p-type doped region 44, via conductor 66 and trench conductor 68 are disposed on the n-type doped region 40, via conductor 70 and trench conductor 72 are disposed on the p-type doped region 38, via conductor 74 is disposed on the n-type doped region 52 to connect to an oxide semiconductor transistor (not shown) formed afterwards, via conductor 76 and trench conductor 72 are disposed on the gate structure 48, via conductor 78 and trench conductor 80 are disposed on the n-type doped region 54, and via conductor 82 and trench conductor 80 are disposed on the resistor 24.

Preferably, the p-type doped region 38 of the BJT 20 is electrically connected to the gate structure 48 of the MOS transistor 22 through the trench conductor 72, and the resistor 24 is electrically connected to the n-type doped region 54 of the MOS transistor 22 through the trench conductor 80.

Figure 4:
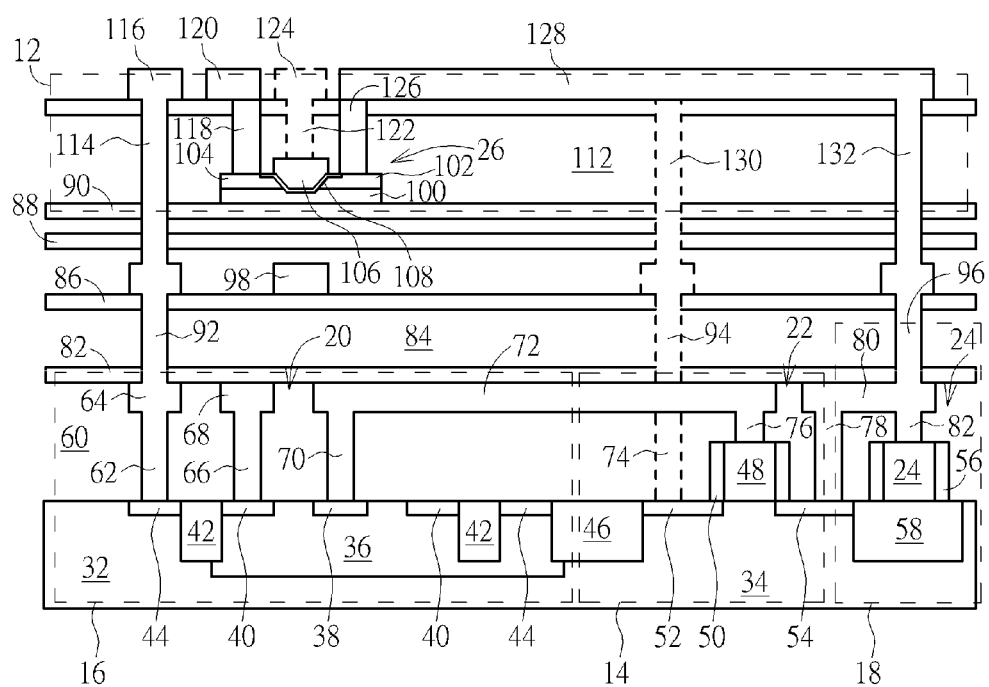
FIG. 4 illustrates a method for fabricating a low dropout regulator according to a preferred embodiment of the present invention following FIG. 2.
Figure 5:
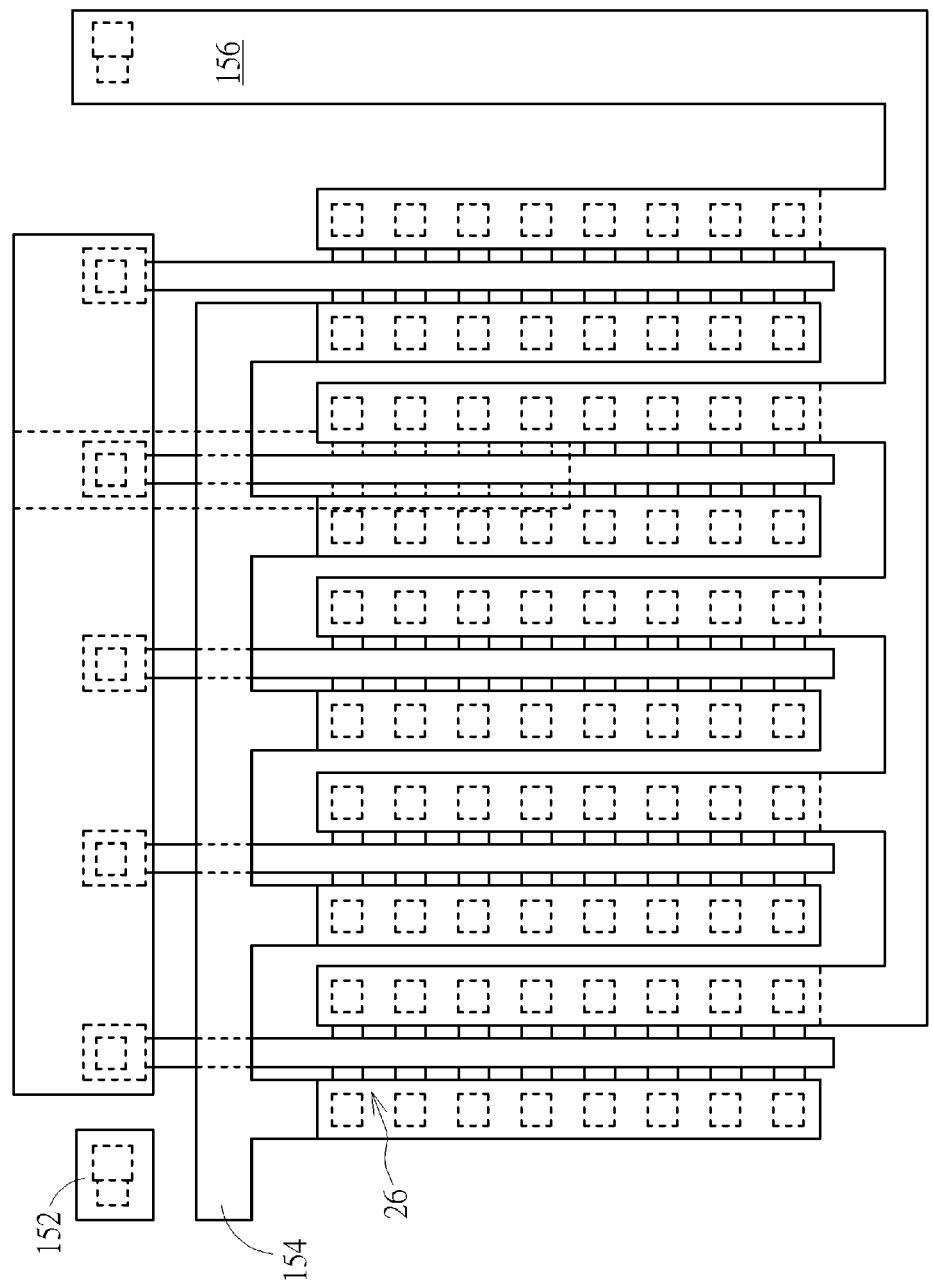
FIG. 5 illustrates a top view of the layout of the pass transistor shown in FIG. 4.

Referring to FIGS. 4-5, FIG. 4 illustrates a method for fabricating a low dropout regulator after FIG. 2 and FIG. 5 illustrates a top view of the layout of pass transistor 12 shown in FIG. 4, in which the pass transistor 12 is preferably represented by an oxide semiconductor field effect transistor (OS-FET) 26.

As shown in FIG. 4, a metal interconnection process is conducted to form a stop layer 82 and dielectric layers 84, 86, 88, 90 on the dielectric layer 60 and a plurality of contact plugs 92, 94, 96 in the dielectric layers 84, 86, 88, 90 and stop layer 82 to establish electrical connections to the BJT 20, MOS transistor 22, and resistor 24 in the lower dielectric layer 60. A gate structure 98 could be formed selectively on the dielectric layer 86 to serve as a back electrode for the OS-FET 26.

In this embodiment, the stop layer 82 could be made of same material as the dielectric layers 86, 88, 90 but different from the dielectric layer 84. For instance, the stop layer 82 and dielectric layer 86, 88, 90 could be made of silicon nitride while the dielectric layer 84 is made of silicon oxide, but not limited thereto.

Next, an OS-FET 26 is formed on the dielectric layer 90. In this embodiment, the OS-FET 26 preferably includes a channel layer 100, a source layer 102 and a drain layer 104 disposed on part of the channel layer 100, a gate structure 106 disposed directly on top of the channel layer 100, and a gate insulating layer 108 disposed between the gate structure 106 and source layer 102, drain layer 104, and channel layer 100.

In this embodiment, the channel layer 100 is an oxide semiconductor layer, which could be selected from the group consisting of indium gallium zinc oxide (IGZO), indium aluminum zinc oxide, indium tin zinc oxide, indium aluminum gallium zinc oxide, indium tin aluminum zinc oxide, indium tin hafnium zinc oxide, and indium hafnium aluminum zinc oxide. The source layer 102 and drain layer 104 could be selected from the group consisting of aluminum, chromium, copper, tantalum, molybdenum, and tungsten, but not limited thereto. The gate insulating layer 108 could be selected from the group consisting of $SiO_2$, SiN, SiON, and SiCN and could also be a single layered structure or a multi-layered structure. The gate structure 106 could be made of same material or different material from the source layer 102 or drain layer 104. For instance, the gate structure 106 could be selected from the group consisting of aluminum, chromium, copper, tantalum, molybdenum, and tungsten, but not limited thereto.

Next, a dielectric layer 112 is formed to cover the OS-FET 26, and a plurality of contact plugs containing via conductors and trench conductors are formed to electrically connect the BJT 20, the MOS transistor 22, and the resistor 24. Specifically, via conductors 114, 118, 122, 126, 130, 132 and trench conductors 116, 120, 124, 128 are formed in the dielectric layer 112, in which via conductor 118 and trench conductor 120 are disposed on the drain layer 104, via conductor 122 and trench conductor 124 are disposed on the gate structure 106, and via conductor 126 and trench conductor 128 are disposed on the source layer 102. In addition, the source layer 102 is electrically connected to the resistor 24 through trench conductor 128 and via conductor 132.

It should be noted that in order to emphasize the structure of the OS-FET 26, only a single OS-FET 26 is disclosed in FIG. 4 while a plurality of OS-FETs 26 arranged according to an array is disclosed in FIG. 5. Moreover, the conductive types of the doped regions for the BJT 20, MOS transistor 22, and OS-FET 26 could also be adjusted according to the demand of the product, which is also within the scope of the present invention.

Figure 6:
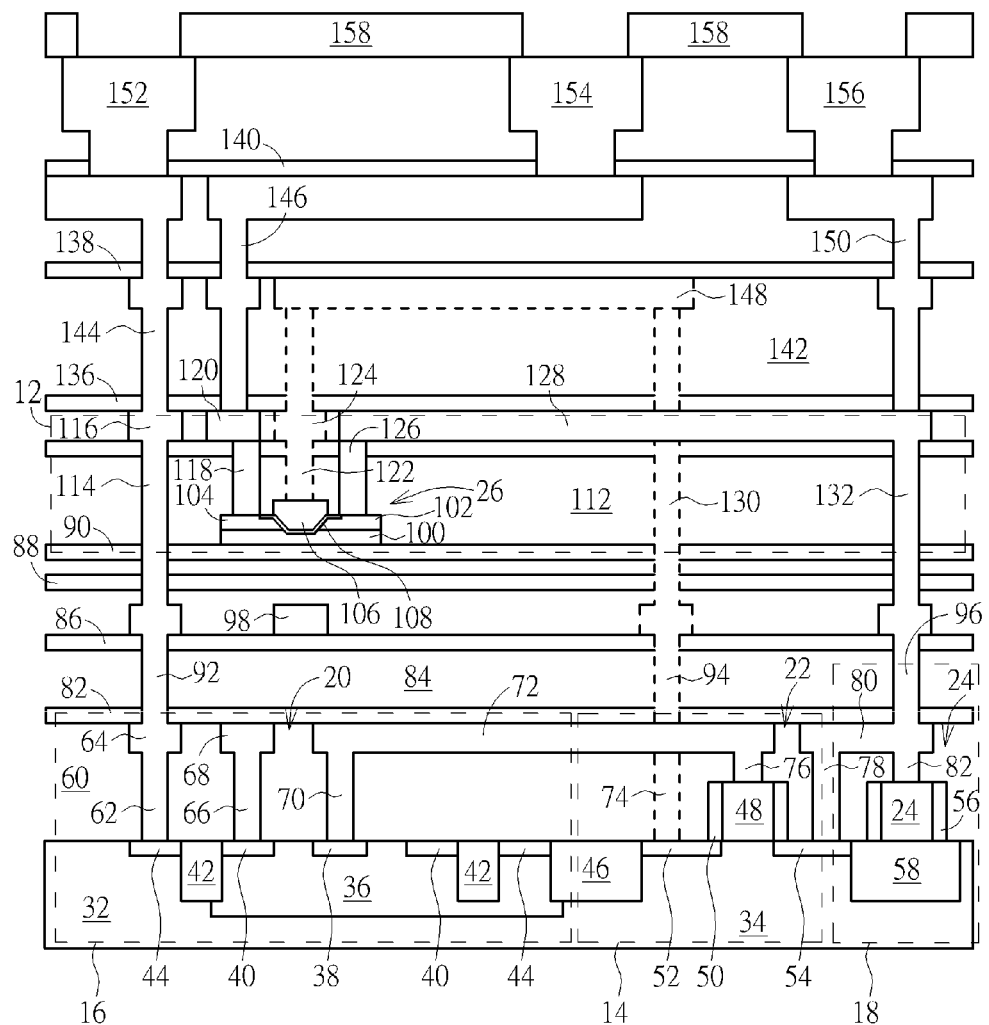
FIG. 6 illustrates a method for fabricating a low dropout regulator according to a preferred embodiment of the present invention following FIG. 4.

Next, as shown in FIG. 6, additional metal interconnection process could be conducted to form stop layers 136, 138, 140 and dielectric layer 142 on the dielectric layer 112, and multiple contact plugs 144, 146, 148, 150 are formed in the stop layer 136, 138, 140 and dielectric layer 142 to electrically connect the BJT 20 and OS-FET 26 to external circuits. For instance, the p-type doped region 44 of the BJT 20 is electrically connected to a ground 152 through the contact plug 144, the drain layer 104 of the OS-FET 26 is electrically connected to an input voltage (Vin) 154 through the contact plug 146, the gate structure 106 of the OS-FET 26 is electrically connected to the n-type doped region 52 of the MOS transistor 22 through the contact plug 148, and the source layer 102 of OS-FET 26 and resistor 24 are electrically connected to an output voltage (Vout) 156 through the contact plug 150. A plurality of contact pads 158 could further be formed on the dielectric layer 142 to expose part of the ground 152, part of the input voltage 154, and part of the output voltage 156. This completes the fabrication of a low dropout regulator according to a preferred embodiment of the present invention.

Conventionally, pass transistors within a low dropout regulator are constituted by MOS transistors. This design however consumes a great portion of space when BJTs are integrated with MOS transistors and also results in serious leakage problem. In order to resolve this issue, the present invention uses OS-FETs to replace conventional MOS transistors to serve as pass transistors within the low dropout regulator. By doing so, it would be desirable significantly reduce the amount of area being consumed by stacking the OS-FET on top of other elements such as BJTs and other MOS transistors, and also improve the leakage of the device substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate;
   forming a bipolar junction transistor (BJT) on the substrate;
   forming a metal-oxide semiconductor (MOS) transistor on the substrate and electrically connected to the BJT;
   forming a resistor on the substrate and electrically connected to the MOS transistor;
   forming a dielectric layer on the substrate to cover the BJT, the MOS transistor, and the resistor; and
   forming an oxide-semiconductor field-effect transistor (OS-FET) on the dielectric layer and electrically connected to the MOS transistor and the resistor.

2. The method of claim 1, wherein the BJT comprises:
   a well in the substrate;
   a first doped region in the well;
   a second doped region around the first doped region;
   a shallow trench isolation (STI) around the well; and
   a third doped region around the STI.

3. The method of claim 2, wherein the first doped region and the second doped region comprise different conductive type, and the first doped region and the third doped region comprise the same conductive type.

4. The method of claim 2, wherein the MOS transistor comprises:
   a first gate structure on the substrate;
   a fourth doped region adjacent to one side of the first gate structure; and
   a fifth doped region adjacent to another side of the first gate structure.

5. The method of claim 4, wherein the first gate structure is electrically connected to the first doped region of the BJT.

6. The method of claim 4, wherein the STI is between the first doped region of the BJT and the fourth doped region of the MOS transistor.

7. The method of claim 4, wherein the resistor is electrically connected to the fifth doped region.

8. The method of claim 4, wherein the OS-FET comprises:
   a channel layer on the dielectric layer;
   a second gate structure on the channel layer;
   a source layer adjacent to one side of the second gate structure; and
   a drain layer adjacent to another side of the second gate structure.

9. The method of claim 8, wherein the second gate structure of the OS-FET is electrically connected to the fourth doped region of the MOS transistor.

10. The method of claim 8, wherein the source layer of the OS-FET is electrically connected to the resistor.

11. A semiconductor device, comprising:
    a substrate;
    a bipolar junction transistor (BJT) on the substrate;
    a metal-oxide semiconductor (MOS) transistor on the substrate and electrically connected to the BJT;
    a resistor on the substrate and electrically connected to the MOS transistor;
    a dielectric layer on the substrate to cover the BJT, the MOS transistor, and the resistor; and
    an oxide-semiconductor field-effect transistor (OS-FET) on the dielectric layer and electrically connected to the MOS transistor and the resistor.

12. The semiconductor device of claim 11, wherein the BJT comprises:
    a well in the substrate;
    a first doped region in the well;
    a second doped region around the first doped region;
    a shallow trench isolation (STI) around the well; and
    a third doped region around the STI.

13. The semiconductor device of claim 12, wherein the first doped region and the second doped region comprise different conductive type, and the first doped region and the third doped region comprise the same conductive type.

14. The semiconductor device of claim 12, wherein the MOS transistor comprises:
    a first gate structure on the substrate;
    a fourth doped region adjacent to one side of the first gate structure; and
    a fifth doped region adjacent to another side of the first gate structure.

15. The semiconductor device of claim 14, wherein the first gate structure is electrically connected to the first doped region of the BJT.

16. The semiconductor device of claim 14, wherein the STI is between the first doped region of the BJT and the fourth doped region of the MOS transistor.

17. The semiconductor device of claim 14, wherein the resistor is electrically connected to the fifth doped region.

18. The semiconductor device of claim 14, wherein the OS-FET comprises:
- a channel layer on the dielectric layer;
- a second gate structure on the channel layer;
- a source layer adjacent to one side of the second gate structure; and
- a drain layer adjacent to another side of the second gate structure.

19. The semiconductor device of claim 18, wherein the second gate structure of the OS-FET is electrically connected to the fourth doped region of the MOS transistor.

20. The semiconductor device of claim 18, wherein the source layer of the OS-FET is electrically connected to the resistor.

* * * * *